(12) United States Patent
Aihara et al.

(10) Patent No.: US 7,428,682 B2
(45) Date of Patent: Sep. 23, 2008

(54) SEMICONDUCTOR MEMORY DEVICE

(75) Inventors: Yoichiro Aihara, Ome (JP); Masahiko Nishiyama, Ome (JP); Daisuke Sasaki, Ome (JP)

(73) Assignee: Hitachi, Ltd., Tokyo (JP)

( * ) Notice: Subject to any disclaimer, the term of this patent is extended or adjusted under 35 U.S.C. 154(b) by 265 days.

(21) Appl. No.: 11/335,464

(22) Filed: Jan. 20, 2006

(65) Prior Publication Data
US 2006/0195743 A1 Aug. 31, 2006

(30) Foreign Application Priority Data
Feb. 28, 2005 (JP) .............................. 2005-052250

(51) Int. Cl.
G01R 31/28 (2006.01)
(52) U.S. Cl. ........................ 714/738; 714/734; 714/720; 714/718; 714/733
(58) Field of Classification Search .................... None
See application file for complete search history.

(56) References Cited

U.S. PATENT DOCUMENTS 5,535,164 A  7/1996 Adams et al.
6,286,116 B1 * 9/2001 Bhavsar ....................... 714/720
6,550,034 B1 * 4/2003 Riedlinger et al. .......... 714/733

FOREIGN PATENT DOCUMENTS

JP  2000-111618  9/1998

\* cited by examiner

*Primary Examiner*—Jacques Louis-Jacques
*Assistant Examiner*—Steven D Radosevich
(74) *Attorney, Agent, or Firm*—Reed Smith LLP; Stanley P. Fisher, Esq.; Juan Carlos A. Marquez, Esq.

(57) ABSTRACT

In relation to the built-in self-test circuit (BIST circuit) for testing CAM macros, the present invention is intended to provide a means to enable reduction in amount of materials as required for wiring channel region for signal distribution, buffer, FF, etc., and in number of LSI pins, and further, to facilitate mounting on chips. The data generators for CAM testing, inserted between the APG for RAMs and CAM macros, create data to write to the CAM macros by obtaining the address signals directly or by decoding the same signals. The APG is common to all the memory macros, and testing proper to each CAM can be carried out by changing over the operation of the inserted data generators by means of the control signal. The data generators are arranged in the proximity of the CAM macros, the circuits to be tested.

18 Claims, 11 Drawing Sheets

| ADDRESS | WRITE DATA |
|---|---|
| 0000 | 1000000000···00 |
| 0001 | 0100000000···00 |
| 0010 | 0010000000···00 |
| 0011 | 0001000000···00 |
| ⋮ | ⋮ |
| 1110 | 0000000000···10 |
| 1111 | 0000000000···01 |

| ADDRESS | WRITE DATA |
|---------|------------|
| 0000 | x000000000···00 |
| 0001 | 0x00000000···00 |
| 0010 | 00x0000000···00 |
| 0011 | 000x000000···00 |
| ⋮ | ⋮ |
| 1110 | 0000000000···x0 |
| 1111 | 0000000000···0x |

| ADDRESS | WRITE DATA |
| --- | --- |
| 0000 | 00000000···0000 |
| 0001 | 00000000···0001 |
| 0010 | 00000000···0010 |
| 0011 | 00000000···0011 |
| ⋮ | ⋮ |
| 1110 | 00000000···1110 |
| 1111 | xxxxxxxx···xxxx |

| ADDRESS | WRITE DATA |
|---|---|
| 0000 | 1010101010···10 |
| 0001 | 0101010101···01 |
| 0010 | 1010101010···10 |
| 0011 | 0101010101···01 |
| ⋮ | ⋮ |
| 1110 | 1010101010···10 |
| 1111 | 0101010101···01 |

PRIOR ART

SEMICONDUCTOR MEMORY DEVICE

CLAIM OF PRIORITY

The present application claims priority from Japanese application JP 2005-052250 filed on Feb. 28, 2005, the content of which is hereby incorporated by reference into this application.

FIELD OF THE INVENTION

This invention relates to semiconductor integrated circuit devices and, in particular, to semiconductor memory devices with built-in self-testing circuits.

BACKGROUND OF THE INVENTION

Conventionally, some of "RAM Built-in Self-Test (RAM-BIST)" circuits have the configuration that a plurality of RAM (Random Access Memory) macros have built-in BIST circuits on one-to-one correspondence basis to receive and give input and output data respectively. (Refer to an example shown in JP-A No. 111618/2000, FIG. 6.)

Also conventionally, it is observed that some configuration aimed at scaling down BIST circuits adopts a common part in the BIST circuit and designs data exchange with the data input and output circuits which are disposed in the proximity of the RAM macros and are dependent on the array arrangement of the RAM. (Refer to an example shown in JP-A No. 111618/2000, FIG. 1.)

Furthermore, also conventionally, some memory BIST in which CAM (Content Addressable Memory) is included is configured to exchange input and output data directly from the common BIST circuit to a plurality of memory macros including CAM. (Refer to an example shown in U.S. Pat. No. 5,535,164)

Generally, the methods to test the memory macros built in LSI (Large Scale Integration) chips include testing by means of external testing equipments and by means of BIST (Built-in Self-Test) circuit (hereinafter referred to as "RAM-BIST") for testing RAM (Random Access Memory) macros.

The arithmetic pattern generator (hereinafter referred to as "APG") of the conventional RAM-BIST has the function of selection among address initialization, increment, and decrement, and also among write data, expect data, and control signal. A selector allows selection of signals from the external pin input. As disclosed in JP-A No. 111618/2000, FIGS. 1 & 2, write data and expect data are given allocation of one-bit or two-bit signals that are to be allotted respectively to the even number bit and the odd number bit of the macro input/output data, thereby attaining the purpose of decreasing the number of wiring and creating required write data (A110/1 or patterns like stripes and checkerboard).

The configuration disclosed in U.S. Pat. No. 5,535,164 can be cited as an example of the idea of RAM-BIST applied to CAM (Content Addressable Memory). Specifically, the configuration is as mentioned below. As disclosed in FIG. 1, a common BIST circuit is provided corresponding to a plurality of memory macros including CAM and configured so as to exchange with respective macros such input and output signals as address signals, write/search data signals, control signals, expect data signals, and pass/fail signals. If a required type of signal is different with each macro, a proper type of signal is selected according to the control signal given to the BIST circuit.

When the BIST is to be applied to the testing of CAMs, testing the search operation of the CAM will require the BIST to be mounted with functions of creating data different from the RAM, such as to write different data for each address, and to write any one bit in high-level or low-level. In order to achieve the foregoing by means of the configuration disclosed in U.S. Pat. No. 5,535,164, it will be necessitated to enlarge the bit width for the data fed from the BIST circuit and supply as much write data as the data bit width of the CAM. Recently, however, the data width of the CAM is following the trend toward substantial increase. Therefore, in order to distribute signals from the APG to the CAM macros scattered around within the chip, increase is inevitably invited in the aspect of materials such as wiring channel region, buffer cells, flip-flop, etc., because data with a large bit width needs to be transferred. Further, in case equivalent test is made possible from LSI pins, too, the same number of pins as the bit width of the CAM data will be required. Because of the foregoing problems, mounting on the chip is considered difficult.

Figure 9:
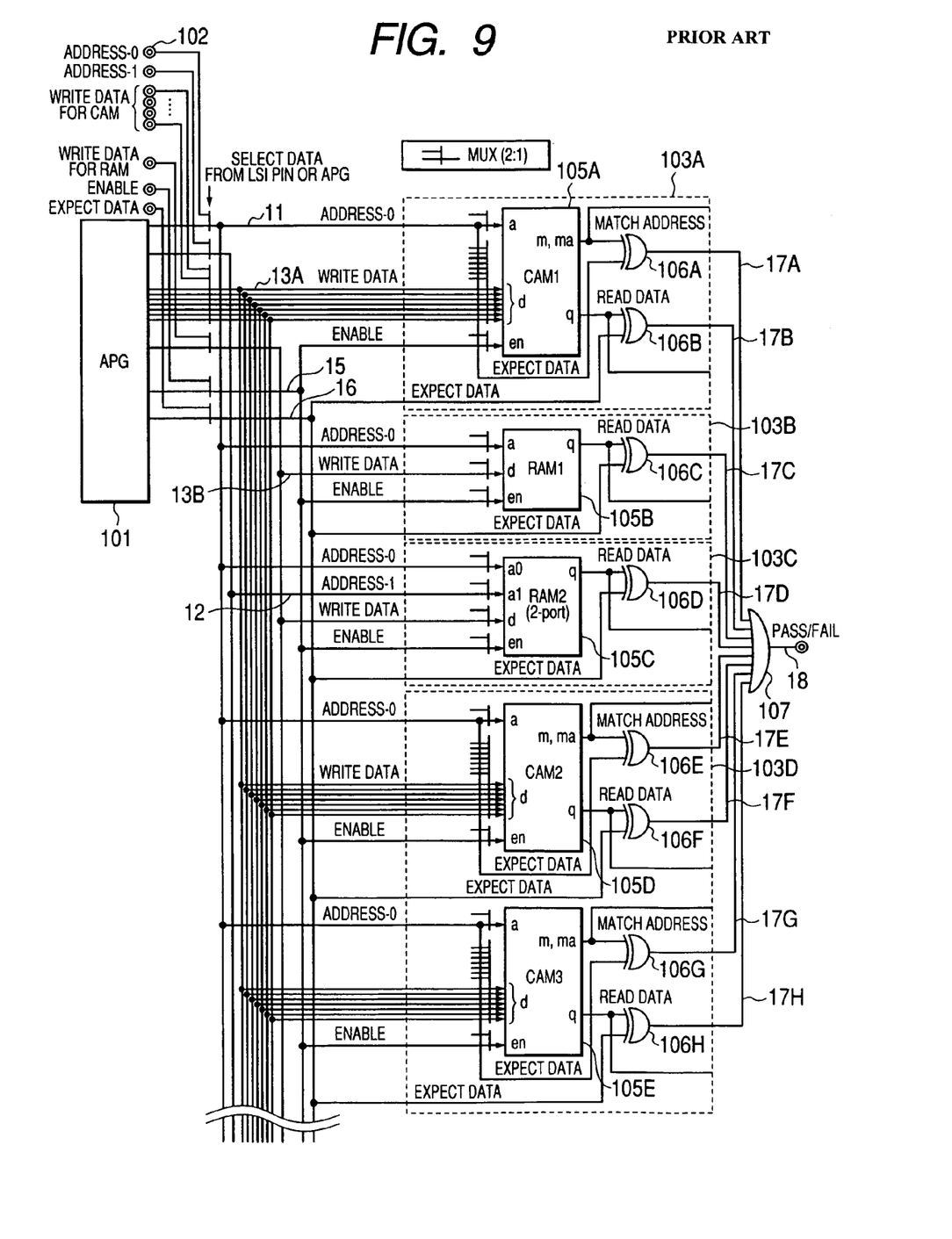
FIG. 9 is a block diagram showing an example of prior art.

FIG. 9 shows an example of configuration of a semiconductor memory device having a BIST circuit based on the conventional technology. The device according to FIG. 9 includes: "a test pattern generator (APG) 101 of memory BIST"; "an external input signal terminal 102 for memory testing"; "testing circuit blocks 103A, 103D for CAM macros and the proximity thereof"; "testing circuit blocks 103B, 103C for RAM macros and the proximity thereof"; "pass/fail signals 17A, 17B, 17C, 17D, 17E, 17F, 17G, and 17H of each memory macro" which are the signals obtained after logical add [OR] is taken for each memory macro with respect to the output of the memory macro; "a test result check circuit 107" which receives input of the pass/fail signals from all the memory macros and give output on the result of the logical add [OR] thereof; and the output of the check circuit or the "pass/fail signal of all the memory macros 18."

The testing circuit blocks 103A and 103D for CAM macros and the proximity thereof comprise "the tested CAM macros 105A, 105D, and 105E" that are shown in FIG. 9 as the CAM macros CAM1, CAM2, and CAM3 and "the comparator circuits 106A, 106B, 106E, 106F, 106G, and 106H to compare the output signals of the memory macros with expect data."

The testing circuit blocks 103B and 103C for RAM macros and the proximity thereof comprise "the tested RAM macros 105B and 105C" shown as RAM macros RAM1 and RAM2 and "the comparator circuit 106C and 106D to compare the output signal of the memory macro with the expect data."

Generally, the tested memory macros 105A, 105B, 105C, 105D, and 105E are different in size from one another and are placed in any location within the chip.

The address signal 11 and 12, write data signal 13A and 13B, and control signal 14 are distributed to the testing circuit blocks 103A, 103B, 103C, and 103D of each memory macro.

Figure 10:
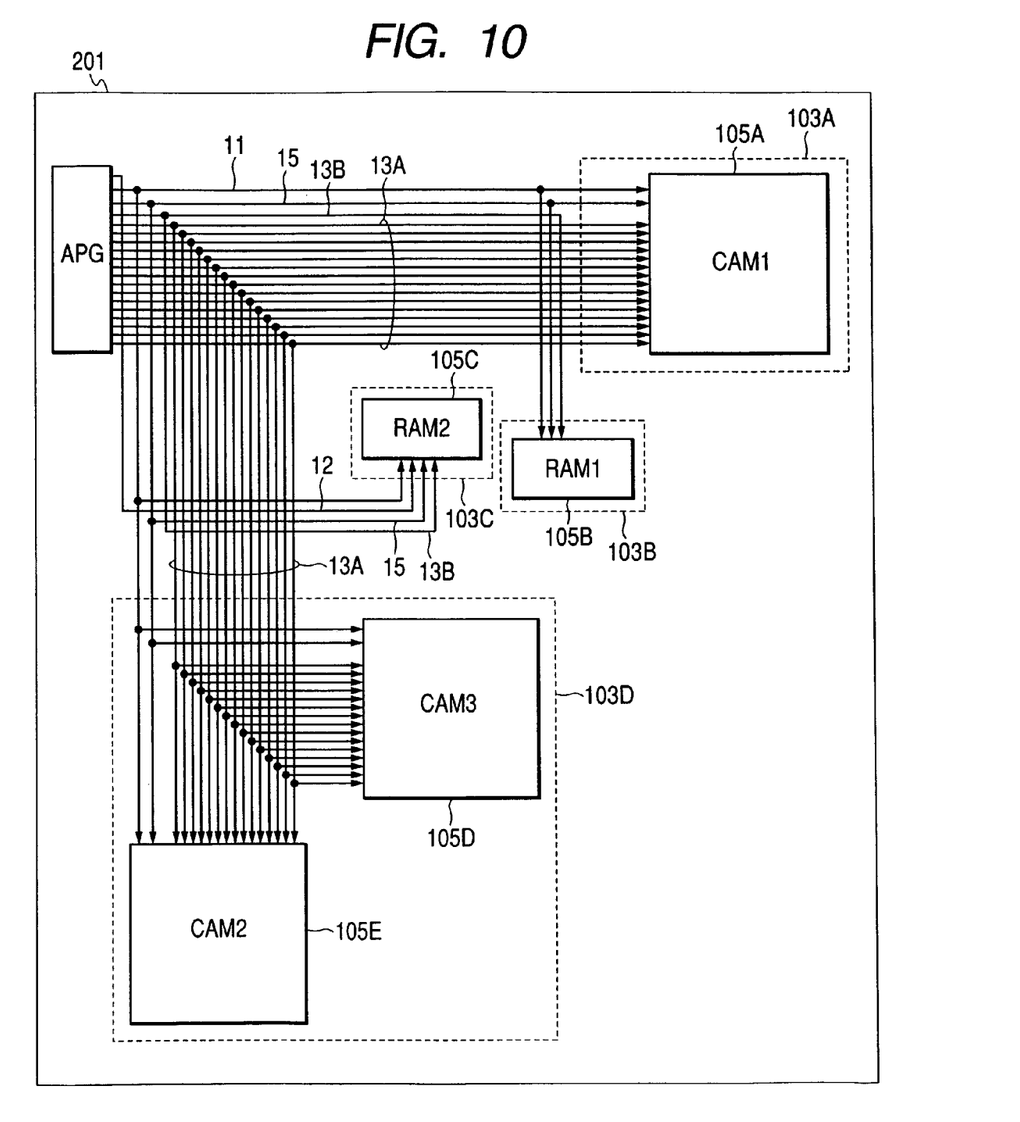
FIG. 10 is a schematic diagram showing an example of layout and wiring of an LSI chip when mounted according to the block diagram of FIG. 9.

With reference to the signal distribution system from APG101 to the tested memory macros 105A, 105B, 105C, 105D, and 105E, FIG. 10 shows a schematic diagram illustrating the layout and wiring in the case that the block diagram shown in FIG. 9 is actually mounted on LSI chips. The selector to select test signals or signals from general logic, and also the output signal distribution system are omitted. The logic gate and wiring in the distribution system are not necessarily connected in the shortest distance, because these are mounted in the region not used in the general logic.

As an example, we now take a look at the number of input signals required for testing the macro 105A when the tested CAM macro 105A is of the 2048-word 576-bit structure. The write/search data signal 13A for the CAM macro is created in APG101 and distributed to the tested CAM macro 105A. Since the same number of signals as the bit width of data is required for the reason mentioned above, 576 signal lines are required to create a 576-bit data. Additional 11 signal lines are required for the address signal, and 3 lines for memory macro cell enable signals 15, one each for read, write and search; thus an aggregate total of 590 signal lines are to be distributed.

For the distribution of these signals, materials and space for wiring channel region, buffer, flip-flop, etc., are needed in abundance. Furthermore, in case equivalent test is made possible from LSI pins, too, as many pins as the bit width of the CAM data become necessary. In the foregoing example, at least 590 pins are necessary for input signals alone for the testing purpose. But if an over-2000-pin multi-pin package is used, it will result that more than half of the signal lines have to be allocated for the testing purpose, a level not practical at all.

As viewed above, chip mounting of the BIST for testing CAM macro will end up as extremely difficult on account of limitations in space, design complexity, and number of LSI pins. The present invention is intended to provide the means of enabling reduction in materials required for signal distribution and number of LSI pins in relation to data creation of the CAM macros as well as the means of facilitating mounting related circuits on chips.

SUMMARY OF THE INVENTION

One of preferred embodiments of the semiconductor memory device of the present invention is shown below. The semiconductor memory device is composed of a plurality of RAM macros, a plurality of CAM macros, a test pattern generating circuit configured to generate a first test pattern to test the plurality of RAM macros and the plurality of CAM macros and connected in common to the plurality of RAM macros and the plurality of CAM macros, and a data generator configured to create a second test pattern to test at least one corresponding CAM macro out of the plurality of CAM macros in accordance with the first test pattern input from the test pattern generating circuit and connected to the at least one corresponding CAM macro; the plurality of RAM macros, the plurality of CAM macros, the test pattern generating circuit, and the data generator being formed on a single chip of semiconductor integrated circuit; wherein the length of wiring channels connecting the data generator with the at least one corresponding CAM macro is shorter than the length of the wiring channels connecting the test pattern generating circuit with the data generator and wherein the number of wiring channels connecting the data generator with the at least one corresponding CAM macro is more than the number of the wiring channels connecting the test pattern generating circuit with the data generator.

With respect to the semiconductor memory device of the present invention, logic (specifically it is a data generator DG) is inserted between the test pattern generating circuit APG for RAM and the CAM macro, and the address signal for RAM is taken directly from the address signal for RAM or decoded through the aforesaid logic to create write data for CAM macro. The APG is common to a plurality of memory macros; for example, it can be made as common to all the memory macros formed on a single semiconductor chip. The test proper to the CAM macros within all the memory macros can be performed by switching over the inserted logic aforesaid. The inserted logic aforesaid is arranged in the proximity of the CAM macro or the tested circuit.

Adopting the present invention makes it possible to cut down the amount of materials required for signal distribution of the CAM-BIST circuit formed on a semiconductor chip and also the number of LSI pins.

DETAILED DESCRIPTION OF THE PREFERRED EMBODIMENTS

Preferred embodiments of the present invention are described below in detail with reference to the accompanying drawings.

Figure 1:
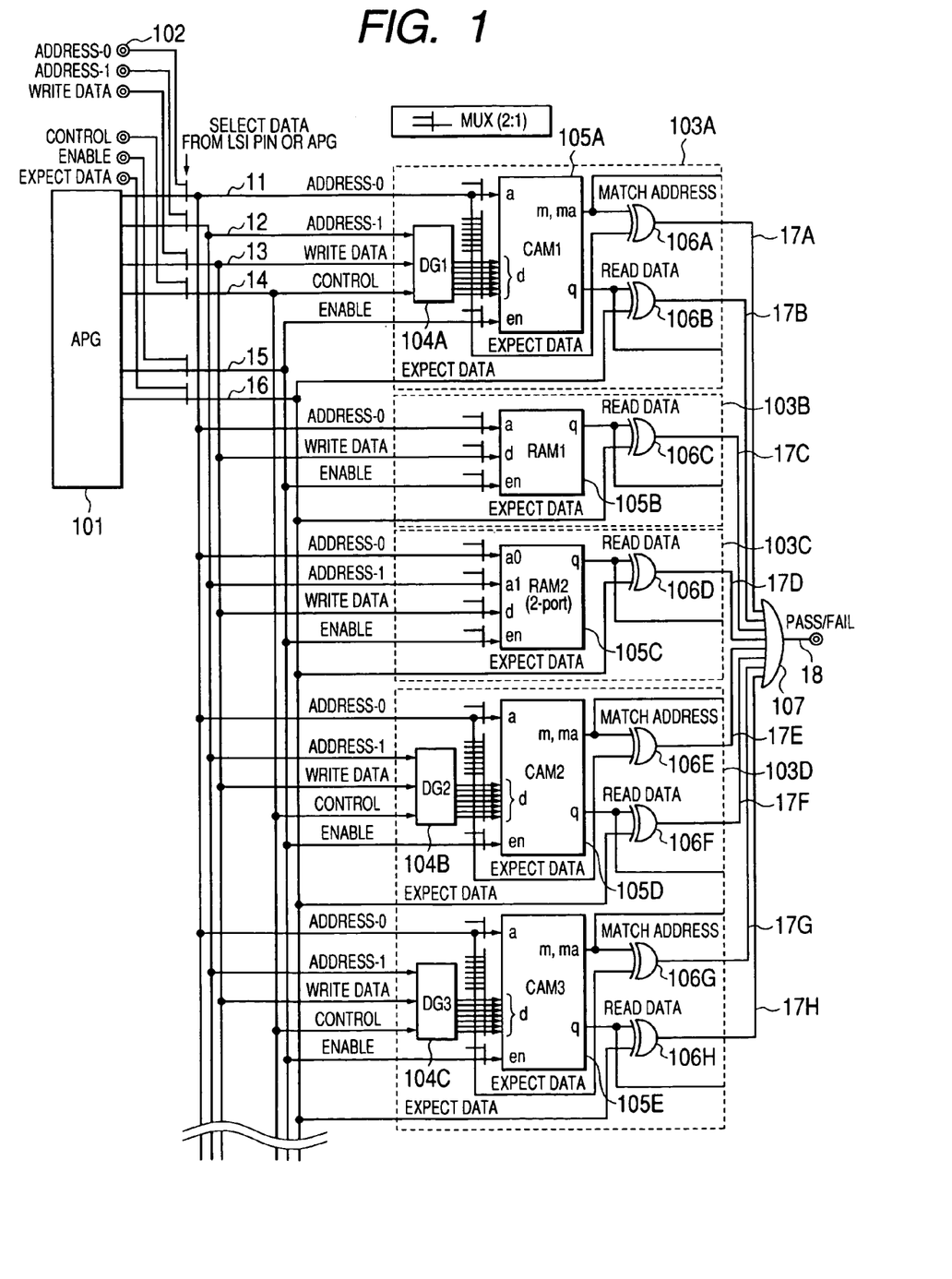
FIG. 1 is a block diagram showing an embodiment of the BIST circuit configured as the semiconductor integrated circuit of the present invention.

FIG. 1 shows an example of structure of the semiconductor memory device having the BIST circuit according to this invention. The device of FIG. 1 includes "the memory BIST test pattern generator (APG) 101," "the external input signal terminal 102 for memory testing," "the testing circuit blocks 103A and 103D for the CAM macro and the proximity thereof," "the testing circuit blocks 103B and 103C for the RAM macro and the proximity thereof," "pass/fail signals 17A, 17B, 17C, 17D, 17E, 17F, 17G, and 17H of each memory macro" which are the signals obtained after logical add [OR] is taken for each memory macro with respect to the output of the memory macro," "the test result check circuit 107" which is a signal obtained after logical add [OR] is taken of the pass/fail signals from all the memory macros, and the output of the check circuit or "the pass/fail signal 18 of all the memory macros."

The testing circuit blocks 103A and 103D for CAM macros and the proximity thereof include "the tested CAM macros 105A, 105D, and 105E" shown as the CAM macros CAM1, CAM2, and CAM3, "the data generators 104A, 104B, and 104C for CAM testing" shown as DG1, DG2, and DG3 [SAKATA1] which, according to the signal from the APG 101, create write data for the tested CAM macros 105A, 105D, and 105E, and "the comparator circuits 106A, 106B, 106E, 106F, 106G, and 106H to compare the memory macro output signals with the expect data."

The testing circuit blocks 103B and 103C for the RAM macros and the proximity thereof include "the tested RAM macros 105B and 105C" shown also as the RAM macros RAM1 and RAM2 and "the comparator circuits 106C and 106D to compare the memory macro output signals with the expect data."

Generally, the tested memory macros 105A, 105B, 105C, 105D, and 105E are different in size from one another and arranged in any place within the chip. Also, the data generators for CAM testing 104A, 104B, and 104C are arranged in a close proximity of the tested CAM macros. More concretely, arrangement for example is made so that the length of the wiring channels connecting the data generator 104A with at least one of corresponding CAM macro 105A may be shorter than the length of the wiring channels connecting the test pattern generating circuit 101 with the data generator 104A. Much the same can be said concerning the locational relations among the data generators 104B and 104C, the CAM macro 105D and 105E, and the test pattern generating circuit 101. For example, the number of the wiring channels connecting the data generator 104A with at least one corresponding CAM macro 105A is configured to be more than the number of wiring channels connecting the test pattern generating circuit 101 with the data generator 104A, or in other words, the number of wiring channels entering the data generator is configured to be less than the number of wiring channels exiting the data generator. In this way, the configuration is realized so that less number of wiring channels are used for connecting a long distance and a short wiring is adopted where the number of wiring channels is heavy. Thus, it has been made possible to effectively reduce the surface area of the semiconductor integrated circuit chip on which this circuitry is mounted in its entirety.

Figure 11:
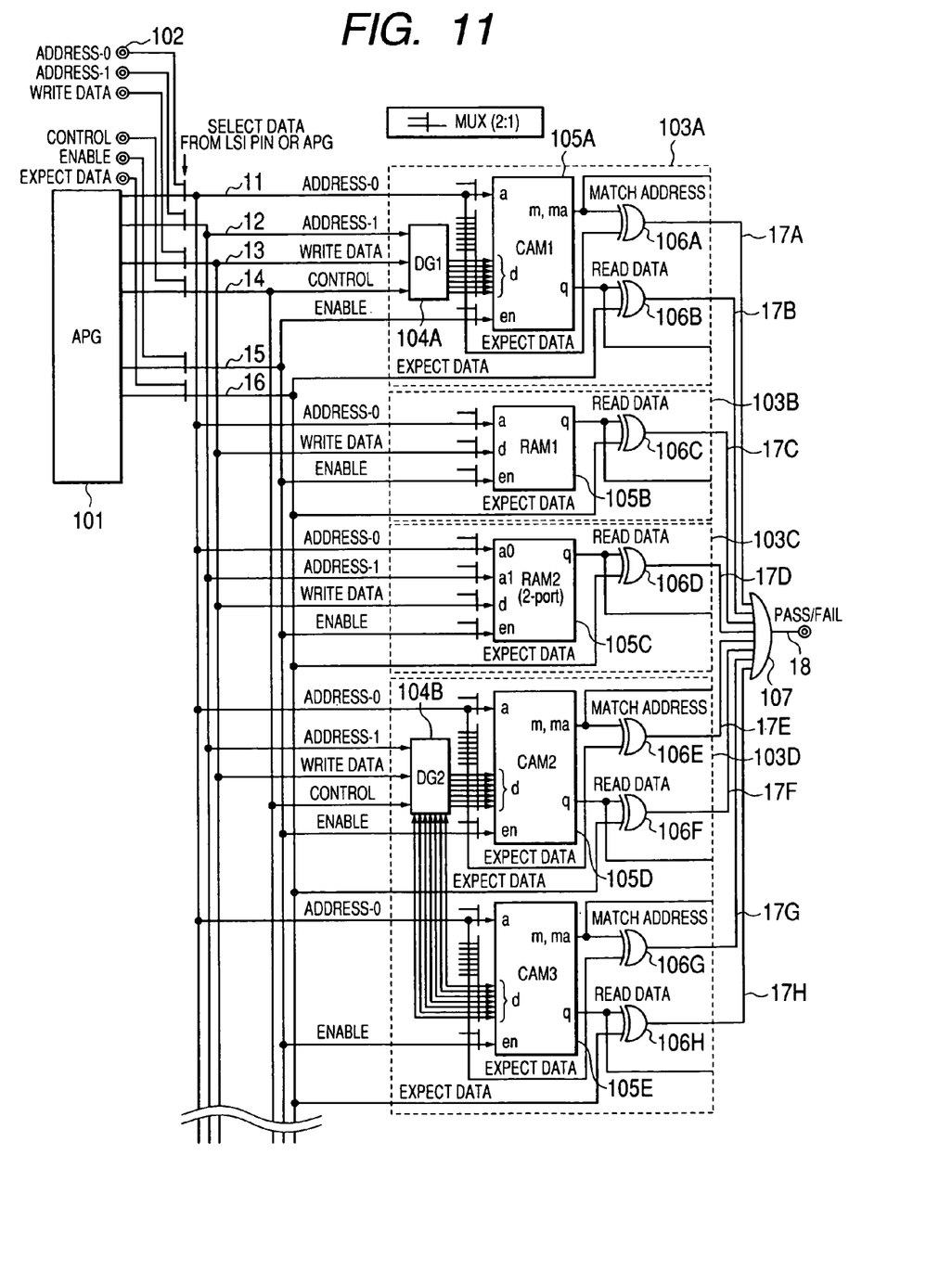
FIG. 11 is a block diagram showing an embodiment of the BIST circuit configured as the semiconductor integrated circuit of the present invention, other than the example shown in FIG. 1.

As shown in FIG. 11, a plurality (2 units in FIG. 11) of CAM macros (CAM2 and CAM3) may be configured to use a unit of data generator 104B in common. For example, when a plurality of macros are disposed in close proximity like CAM2 and CAM3 in FIG. 11, these plurality of macros may use a unit of data generator in common, and still it is possible to constrain the wiring length between the data generator and the CAM macros as well as the surface area of the chip within some limited extent. Besides, saving in the number of data generators and simplifying of the whole circuit configuration on the chip become feasible. For these reasons, the embodiment in FIG. 11 is preferable particularly when a plurality of CAM macros are disposed in close proximity.

The test pattern generating circuit APG is configured to generate a first test pattern ADDRESS-1 for testing a plurality of RAM macros 105B and 105C and a plurality of CAM macros 105A, 105D, and 105E and connected commonly to a plurality of RAM macros 105B and 105C and a plurality of CAM macros 105A, 105D, and 105E.

The data generators DG1, DG2, and DG3 are configured to generate a second test pattern (the signal 22A and 22B input to the terminal "d") for testing at least one corresponding CAM macro (one in the case of FIG. 1, and one or two in the case of FIG. 11) out of a plurality of CAM macros 105A, 105D, and 105E according to the first test pattern ADDRESS-1 input from the test pattern generating circuit APG, while they are connected to at least one corresponding CAM macro.

Specifically, for example, the address signals 11 and 12, the write data signal 13, and the control signal 14 are distributed to the testing circuit blocks 103A, 103B, 103C and 103D for respective memory macros. After receiving the address signal 12 and the control signal 14, the data generators 104A and 104B create data in the size equal to the bit width of the write data for the tested CAM macros 105A, 105D, and 105E and feed the data to the tested CAM macros.

Figure 8:
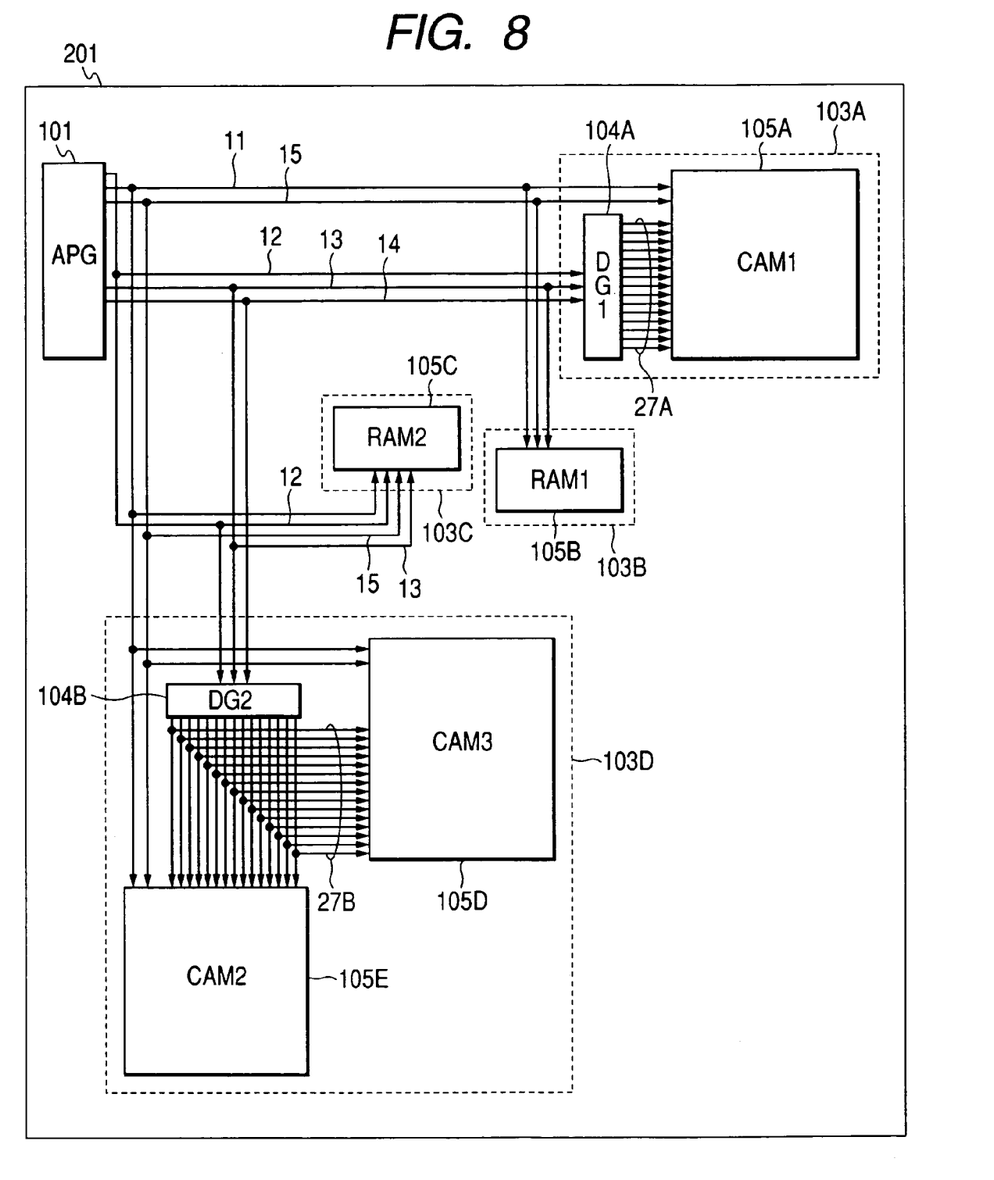
FIG. 8 is a schematic diagram showing an example of layout and wiring of an LSI chip when mounted according to the block diagram of FIG. 1.

FIG. 8 is a schematic diagram showing the layout and wiring of the single-chip semiconductor integrated circuit 201 mounted with the semiconductor memory device illustrated in the block diagram FIG. 11 with respect to the distribution system of the signals from APG 101 to the tested memory macros 105A, 105B, 105C, 105D, and 105E. A plurality of RAM macros (2 pieces in FIG. 8), a plurality of CAM macros (3 pieces in FIG. 8), the test pattern generating circuit APG 101, and the data generator DG1 (104A) and DG2 (104B) are monolithically formed on the single-chip semiconductor integrated circuit 201. A selector to choose either test signals or general logic signals, and the output signal distribution system are omitted in the drawing. Since the logic gate and the wiring of the distribution system are mounted on the chip in the areas which the general logic does not use, connections are not necessarily made within the shortest distance.

What is different from the foregoing FIG. 9 and FIG. 10 lies in that the logic equivalent to the data generator 104A and 104B for CAM macro testing is arranged in the proximity of the memory macros of the testing circuit blocks 103A and 103D for each CAM macro. That is, the wiring to connect the data generator 104A with at least one corresponding CAM macro 105A is so arranged that its length may become shorter than the length of wiring to connect the test pattern generating circuit 101 with the data generator 104A. The wiring to connect the data generator 104B with the CAM macros 105D and 105E is likewise arranged so that its length may become shorter than the length of wiring to connect the test pattern generating circuit 101 with the data generator 104B.

As an example, we now take a look at the number of input signals required for testing the macro 105A when the tested CAM macro 105A is of the 2048-word 576-bit structure. The address signal 12 used for creating data of CAM, the write data signal 13, and the data generator control signal 14 are created in APG 101 and distributed to the tested CAM macro 105A. By creating data equal to the data bit width by means of the data generator 104A in FIG. 2 as described afterwards, it becomes possible to create a 576-bit data with 11, 2, and 7 signal lines respectively, or a total of 20 signal lines. Additionally, 11 signal lines for the address signal 11, and 3 signal lines for read, write, and search enable signals 15 for the memory macros, or an aggregate total of 34 signal lines are distributed.

The abovementioned fact indicates that as against the mounting result of 590 signal lines in the aforesaid FIG. 9 and FIG. 10, only 5.7% in wiring channel area, number of buffers, and number of flip-flops is just sufficient in FIG. 8

[SAKATA2] to provide similar [SAKATA3] necessary functions. Furthermore, while the test pins 102 are required to enable testing from the LSI pins, too, equivalent testing can be made possible with approximately 34 input pins, a number equal to the distribution bit number of the signal lines from AGP 101 to the testing circuit blocks 103A and 103D for each CAM macro. For these reasons and in view of the limitations in terms of area, design complexities, and number of LSI pins, chip mounting becomes very easy when built-in BIST is adopted for testing CAM macros.

As viewed above, the fact that the data generators for CAM testing 104A and 104B are located very close to the tested CAM macros and that the address signal 12 distributed from the APG 101 to the data generators for CAM testing 104A and 104B and the write data signal 13 are in the order of several tens of bits, makes it possible to reduce the amount of materials required for signal distribution and the number of LSI pins and facilitates mounting of circuits on chips.

Figure 2:
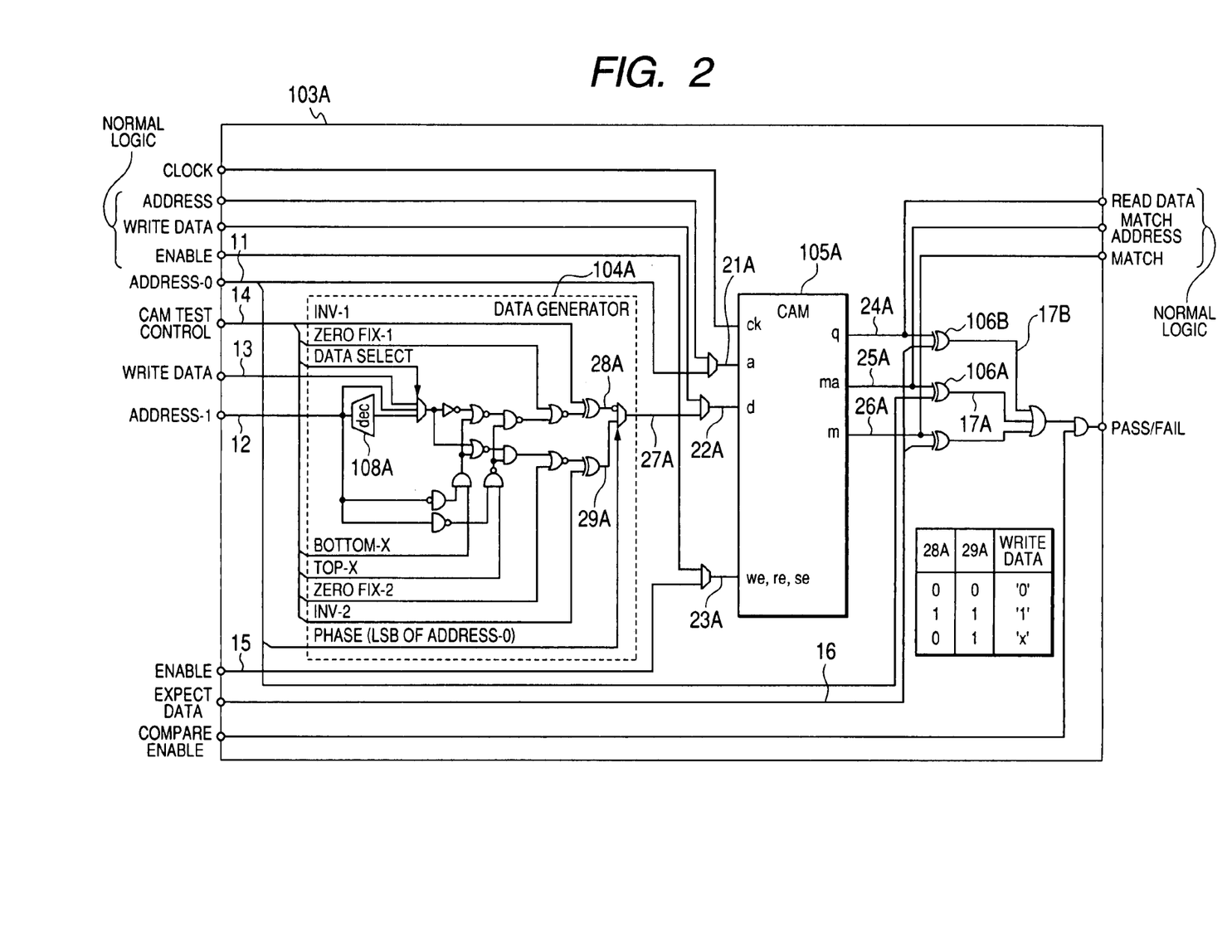
FIG. 2 is a block diagram showing an example of the testing circuit including the CAM macros and the data generators, out of the block diagram of FIG. 1.

FIG. 2 is an example of block diagram showing a portion zoomed up from the block diagram FIG. 1, namely, the CAM macro and the testing circuit 103A in the proximity thereof. In the CAM block 103A, signals relating to the write data signal 22A are input to the tested CAM macro 105A through the data generator for CAM testing 104A. By means of MUX, the input signals 21A, 22A, and 23A to the tested memory macro 105A can be selected from the signal of the general logic, or from the test signals 11, 27A, and 15. The output signals 24A, 25A, and 26A coming out from the tested memory macro 105A are connected to the general logic and at the same time input to the comparator circuit 106A and 106B for comparison with the address 11 separately supplied from APG 101 and the expect data 16. If comparison result is concordant, low level is output to the pass/fail signals 17A and 17B of the memory macro, but high level if discordant.

Figure 3:
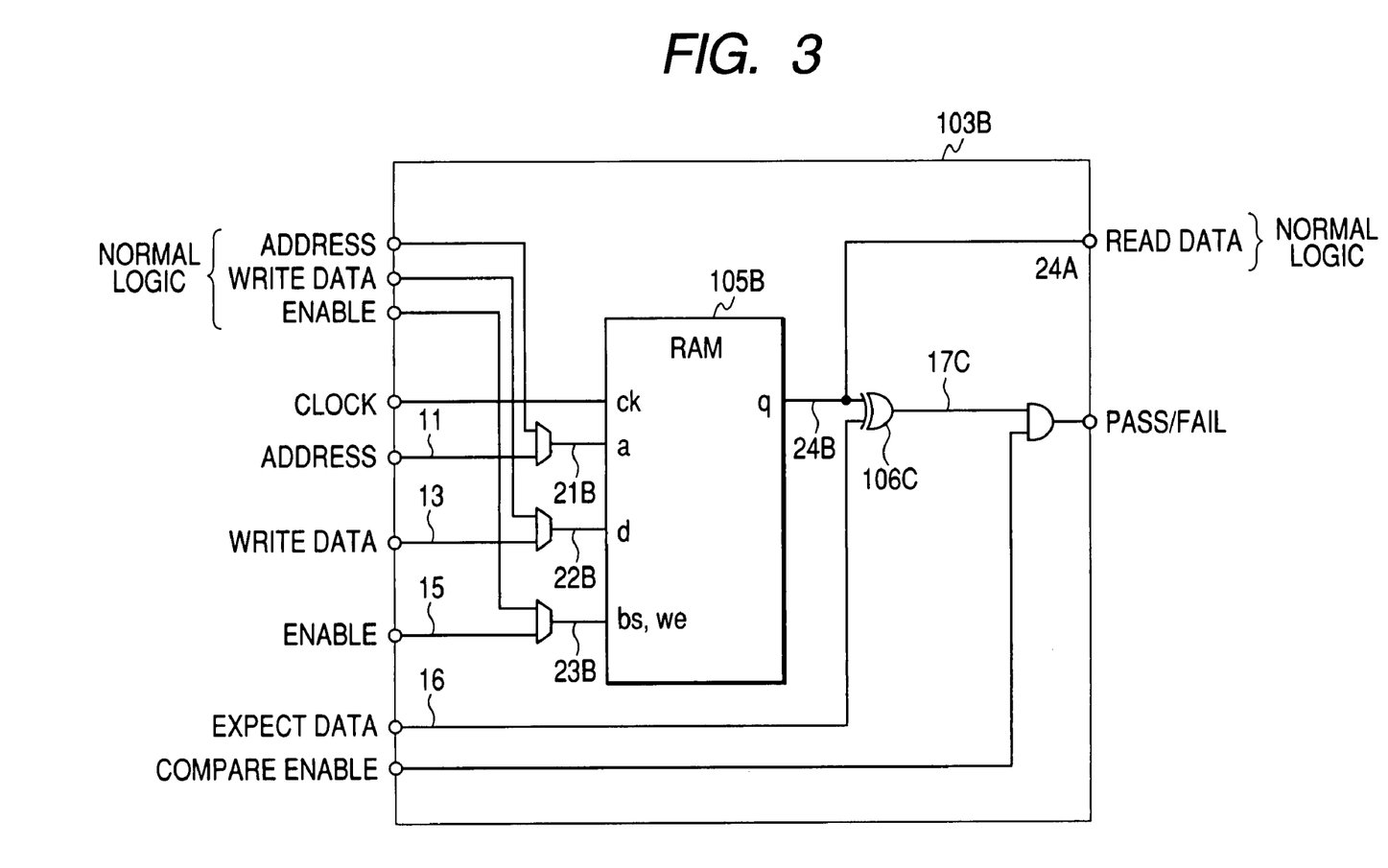
FIG. 3 is a block diagram showing an example of the RAM macros and the testing circuit, out of the block diagram of FIG. 1.

FIG. 3 is a block diagram showing the RAM macro and the testing circuit 103B in the proximity thereof zoomed up from the block diagram of FIG. 1. By means of MUX, the input signals 21B, 22B. and 23B to the tested memory macro 105B are selectable from the signal of general logic or the test signals 11, 13, and 15. The output signal 24B from the tested memory micro 105B is connected to the general logic and at the same time input to the comparator circuit 106C for comparison with the expect data 16 separately supplied from APG 101. If comparison result is concordant, low level is output to the pass/fail signal 17C of the memory macro, but high level if discordant.

In FIG. 1, if the total logical add [OR] 18 covering the pass/fail signals 17A, 17B, 17C, 17D, 17E, 17F, 17G, and 17H from respective memory macros is high level, that means the chip as a whole has been detected to be defective somewhere in the memory macros.

FIG. 4A thru FIG. 7A (those with suffix "A") show in concrete detail the operation and function of the data generator 104A for the CAM testing composing the testing circuit 103A shown in FIG. 2. FIG. 4B thru FIG. 7B (those with suffix "B") show examples of address and write data by way of explanation of the function of the data generator shown in FIG. 4A thru FIG. 7A (with suffix "A"). This example takes up a ternary CAM as the subject. Writing on the CAM macro is carried out in 2 cycles, and the 2-cycle write data {00, 11, 01} be taken as to represent the ternary of the memory cell {0, 1, X} respectively. The data X indicates an indefinite value matching with either data of 0, 1. The input address signal is of several tens of bits, for instance, 2,048 words are equal to 11 bits. The output signal is the write data to the CAM macro reaching as much as some hundreds of bits; for instance, it has a width of 576 bits. The present invention is particularly effective for testing CAM macros having this largeness in data bit width.

Figure 4A:
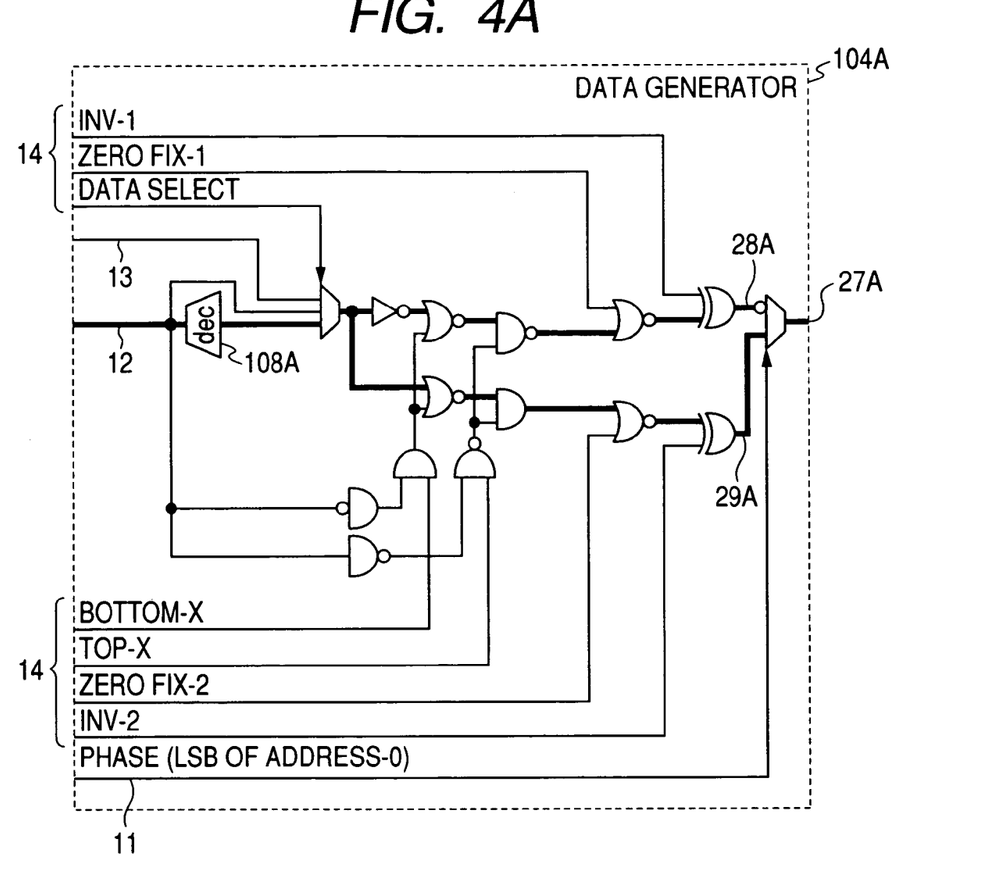
FIG. 4A is a diagram intended to explain the function by which any one reversed bit of data is written in the CAM macros, in relation to the functions of the data generator in the testing circuit of FIG. 2.
Figure 4B:
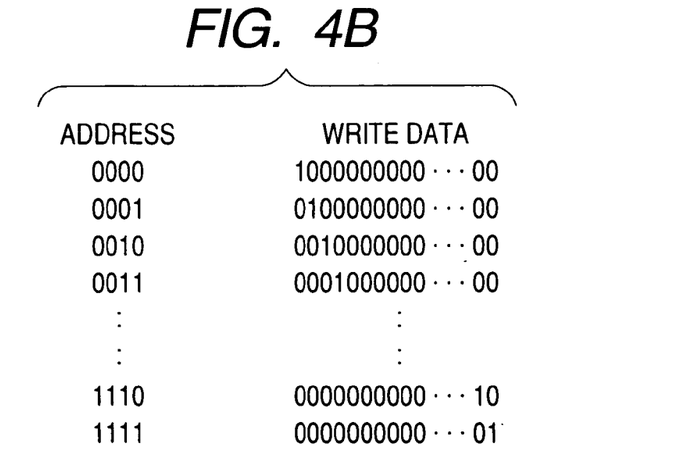
FIG. 4B shows an example of addresses and write data in relation to the functions of the data generator shown in FIG. 4A.
Figure 5A:
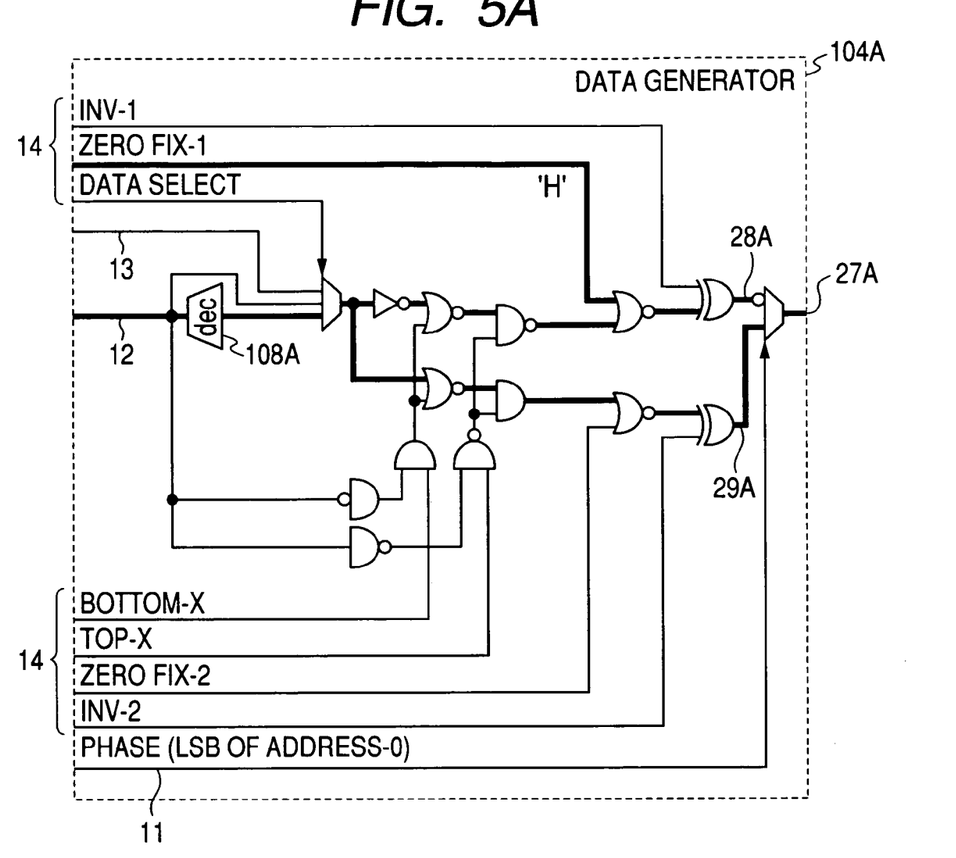
FIG. 5A is a diagram intended to explain the function by which a data with any one-and-only bit taking an indefinite value {X} is written in the CAM macro, in relation to the functions of the data generator in the testing circuits of FIG. 2.
Figure 5B:
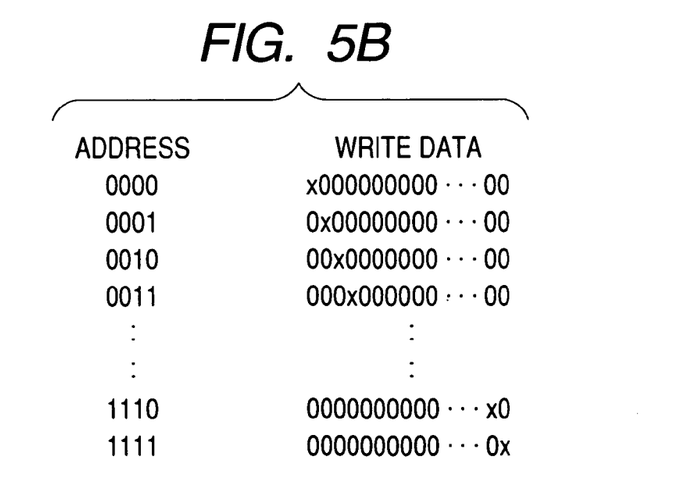
FIG. 5B shows an example of addresses and write data in relation to the explanation on the functions of the data generator shown in FIG. 5A.

FIG. 4A and FIG. 5A show, in a schematic form, the operation and function in relation to writing different data at each address. On the other hand, FIG. 4B and FIG. 5B show examples of address and write data in the above case. In the present example, the address signal 12 is decoded by the decoder circuit 108A, and only for the bit of the same value as the address it is possible to create data different from others. This testing pattern can be applied to an exhaustive testing of those cases wherein the margin of operation is the smallest under the given type of circuit, such as "concordant for 1 bit only" or "discordant for 1 bit only" as may be defined in the search operation.

Figure 6A:
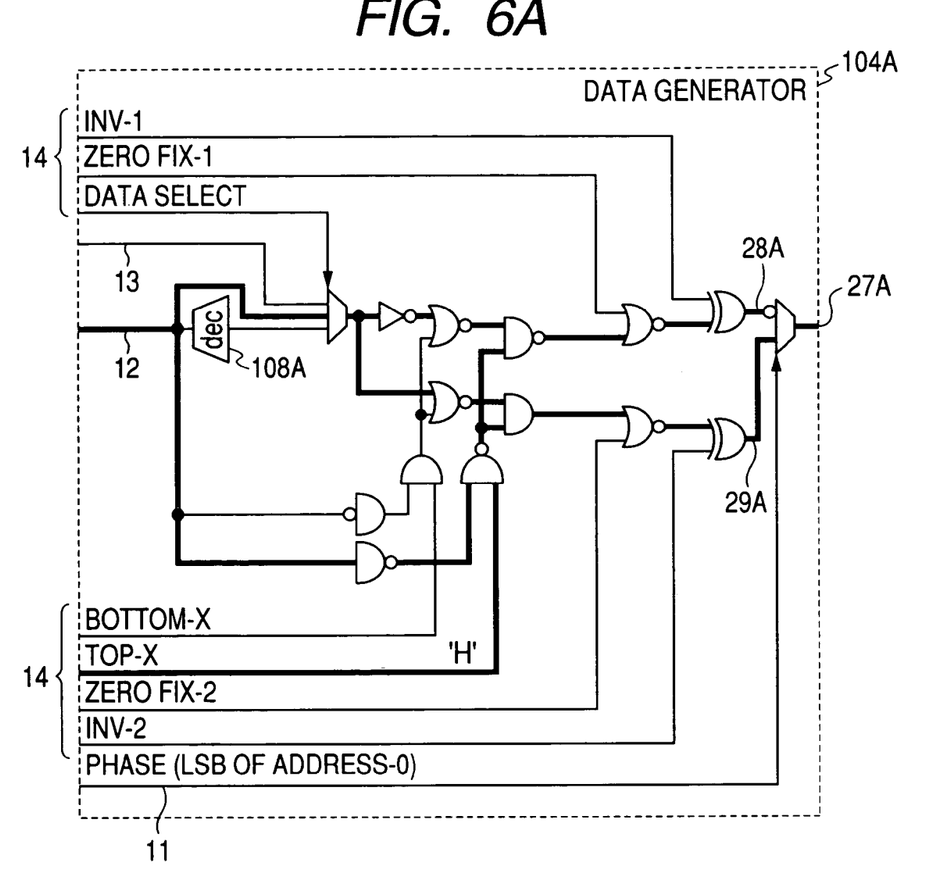
FIG. 6A is a diagram intended to explain the function by which data different from one another are written in the CAM macro for all the addresses therein, in relation to the functions of the data generators in the testing circuits shown in FIG. 2.
Figure 6B:
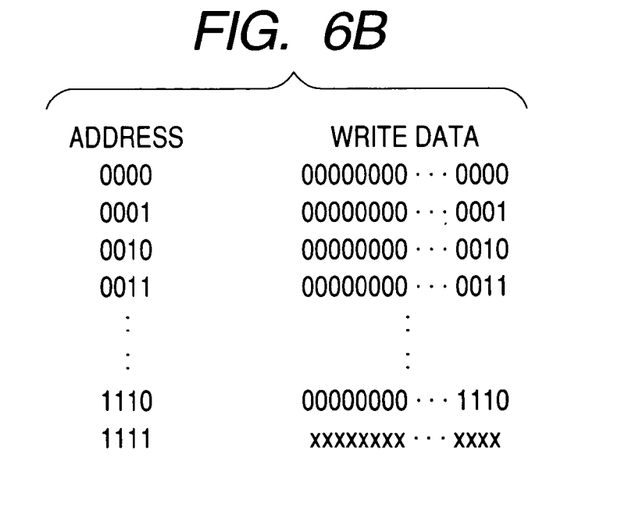
FIG. 6B shows an example of addresses and write data in relation to the explanation on the functions of the data generator shown in FIG. 6A.

FIG. 6A shows in a schematic form the operation and function in relation to writing specific data at specific addresses. On the other hand, FIG. 6B shows examples of address and write data in the above case. In the present example, using the address signal 12 as the write signal 27A as it is provides unique write data to all the addresses and, besides, enables only the most significant bit to create {X} for all the bits. This testing pattern can be applied to the testing of the encoder operation in the case that the most significant bit is made concordant with any address in the search operation.

Figure 7A:
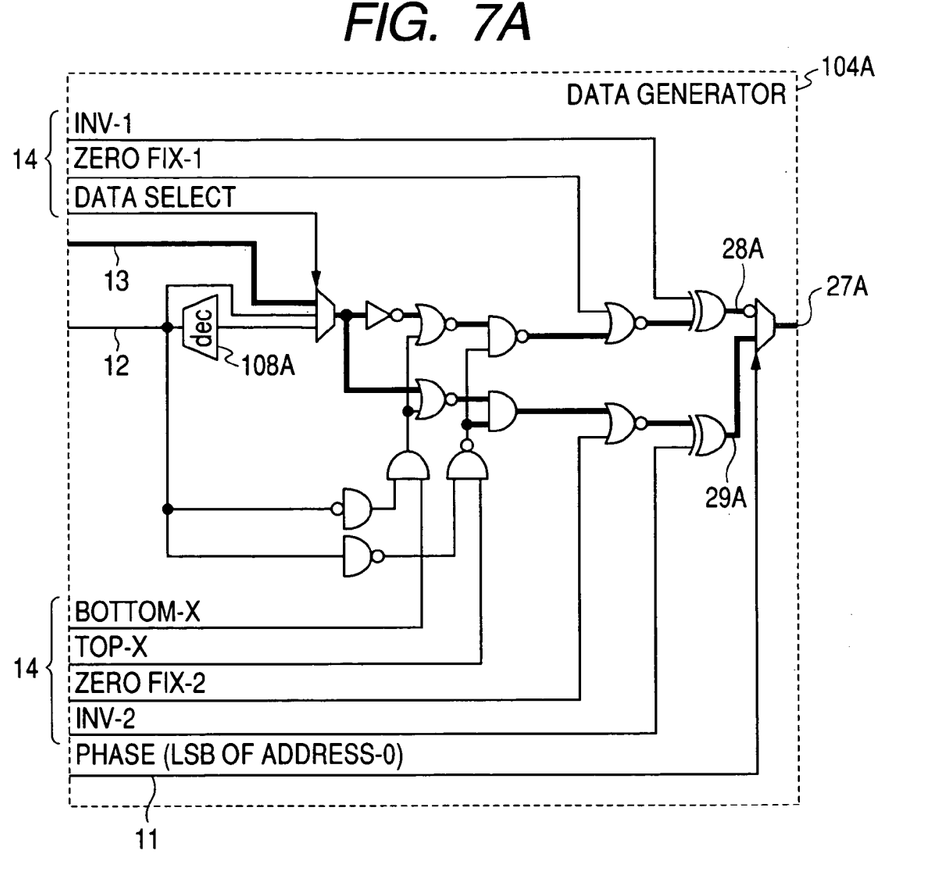
FIG. 7A is a diagram intended to explain the function by which a checkerboard pattern is written in the CAM macro, in relation to the functions of the data generators in the testing circuits shown in FIG. 2.
Figure 7B:
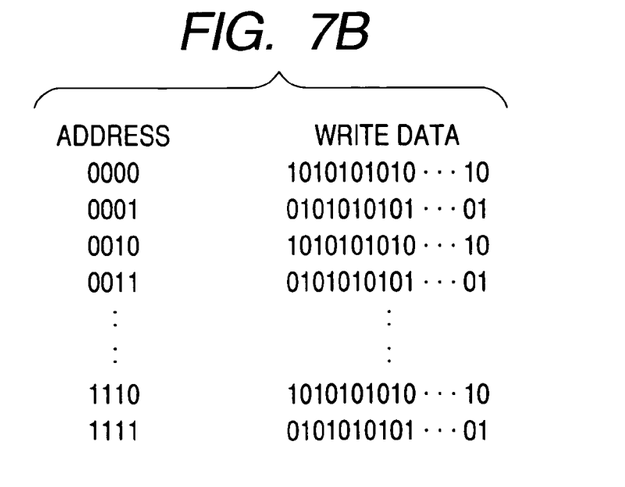
FIG. 7B shows an example of addresses and write data in relation to the explanation on the functions of the data generator shown in FIG. 7A.

FIG. 7A shows the operation and function equivalent to normal RAM testing in a schematic form. On the other hand, FIG. 7B shows examples of address and write data in the above case. The 2-bit write data signal 13 is allocated to even number bits and odd number bits respectively to create the write data for RAM testing (A110/1 or simple patterns like stripes and checkerboard). This testing pattern is applicable to the testing of the operations of RAM such as writing and readout.

The operations and functions shown in FIG. 4A thru FIG. 7A can be changed according to the control signal 14 distributed from the APG 101.

According to the abovementioned embodiments of the present invention, creation of data bits required for testing of the CAM macros is performed in the proximity of the CAM macros. To conduct testing, therefore, it is only needed to distribute the address/write data signals and a few of control signals that the APG already had for conventional RAM testing. Under such circumstances, it is made possible to reduce the amount of materials required for signal distribution and the number of LSI pins and further, to facilitate mounting on the chip. It also becomes possible to reduce the area of LSIs on which a plurality of on-chip CAM/RAM macros are mounted, a point to prove most effective when applied to the CAM macros the data bit width of which extends to some hundreds of bits. Furthermore, with the advancement in function and performance of communication-related equipments and devices, the demand for on-chip CAM and the data bit width are both demonstrating a tendency toward remarkable expansion, and the number of the CAM macros formed on single-chip semiconductor memory devices is also likely to show a dramatic increase. Therefore, it is perceived that the embodiments having the configuration capable to realize reduced chip area are highly useful as the CAM-BIST circuit.

What is claimed is:
1. A semiconductor memory device comprising:
a plurality of RAM macros;
a plurality of CAM macros;
a test pattern generating circuit configured to generate a first test pattern to test said plurality of RAM macros and said plurality of CAM macros, and connected in common to said plurality of RAM macros and said plurality of CAM macros; and a plurality of data generators, wherein each of said data generators is configured to generate a second test pattern to test at least one corresponding CAM macro among said plurality of CAM macros in accordance with said first test pattern input from said test pattern generating circuit and connected to said at least one corresponding CAM macro, wherein said plurality of RAM macros, said plurality of CAM macros, said test pattern generating circuit, and said data generators are formed on a single chip of semiconductor integrated circuit, wherein the length of wiring channels connecting said data generators with said at least one corresponding CAM macro is shorter than the length of the wiring channels connecting said test pattern generating circuit with said data generators, and wherein the number of wiring channels connecting said data generators with said at least one corresponding CAM macro is more than the number of the wiring channels connecting said test pattern generating circuit with said data generators.

2. The semiconductor memory device according to claim 1, wherein each of said data generators has the ability to output ternary, namely 3 types of bit status {0, 1, X} for each bit to be written in the CAM macro.

3. The semiconductor memory device according to claim 2, wherein each of said data generators has the function of creating data different from one another for all the addresses of the CAM macro.

4. The semiconductor memory device according to claim 3, wherein, as a means of creating data different from one another for all the addresses of the CAM macro, each of said data generators takes up the address signals as input signals in creating data to write to the memory macro.

5. The semiconductor memory device according to claim 2, wherein each of said data generators has the function of creating data with any one-and-only reversed bit in the CAM macro.

6. The semiconductor memory device according to claim 5, wherein, as a means of creating data with any one-and-only reversed bit in the CAM macro, each of said data generators has a decoder circuit to create data to write to the memory macro by using the address signal for input signal.

7. The semiconductor memory device according to claim 1, wherein said function of each of said data generators and the function of CAM are materialized in a single macro unit.

8. The semiconductor memory device according to claim 7, wherein the test pattern supplied to said macro is selectable from either the output of said test pattern generating circuit or the input from the external input pin of LSI.

9. The semiconductor memory device according to claim 7, wherein each of said data generators is able to select input used for creating data to write to the memory macro from either the address signal or the data signal.

10. A semiconductor memory device comprising:
a plurality of RAM macros;
a plurality of CAM macros;
a test pattern generating circuit configured to generate a first test pattern to test said plurality of RAM macros and said plurality of CAM macros, and connected in common to said plurality of RAM macros and said plurality of CAM macros; and a plurality of data generators, wherein each of said data generators is configured to generate a second test pattern to test a plurality of corresponding CAM macros among said plurality of CAM macros in accordance with said first test pattern input from said test pattern generating circuit and connected to said plurality of corresponding CAM macros, wherein said plurality of RAM macros, said plurality of CAM macros, said test pattern generating circuit, and said data generators are formed on a single chip of semiconductor integrated circuit, wherein the length of wiring channels connecting said data generators with said plurality of corresponding CAM macros is shorter than the length of the wiring channels connecting said test pattern generating circuit with said data generators, and wherein the number of wiring channels connecting said data generators with said plurality of corresponding CAM macros is more than the number of the wiring channels connecting said test pattern generating circuit with said data generators.

11. The semiconductor memory device according to claim 10,
wherein each of said data generators has the ability to output ternary, namely 3 types of bit status {0, 1, X} for each bit to be written in the CAM macro.

12. The semiconductor memory device according to claim 11,
wherein each of said data generators has the function of creating data different from one another for all the addresses in the CAM macro.

13. The semiconductor memory device according to claim 12,
wherein as a means of creating data different from one another for all the addresses of the CAM macro, each of said data generators takes up the address signals as input signals in creating data to write to the memory macro.

14. The semiconductor memory device according to claim 11,
wherein each of said data generators has the function of creating data with any one-and-only reversed bit in the CAM macro.

15. The semiconductor memory device according to claim 14,
wherein as a means of creating data with any one-and-only reversed bit in the CAM macro, each of said data generators has a decoder circuit to create data to write to the memory macro by using the address signal for input signal.

16. The semiconductor memory device according to claim 10,
wherein said function of each of the data generators and the function of CAM are materialized in a single macro unit.

17. The semiconductor memory device according to claim 16,
wherein the test pattern supplied to said macro is selectable from either the output of said test pattern generating circuit or the input from the external input pin of LSI.

18. The semiconductor memory device according to claim 16,
Wherein each of said data generators is able to select the input used for creating data to write to the memory macro from either the address signal or the data signal.

* * * * *